United States Patent [19]

Levy

[11] Patent Number: 5,976,310
[45] Date of Patent: Nov. 2, 1999

[54] PLASMA ETCH SYSTEM

[75] Inventor: Karl B. Levy, Los Altos, Calif.

[73] Assignee: Applied Materials, Inc., Santa Clara, Calif.

[21] Appl. No.: 08/798,672

[22] Filed: Feb. 11, 1997

Related U.S. Application Data

[63] Continuation of application No. 08/367,909, Jan. 3, 1995, abandoned.

[51] Int. Cl.$^6$ .............................. H05H 1/00; H01L 21/302
[52] U.S. Cl. ............................................................. 156/345
[58] Field of Search ........................ 156/345; 118/723 E, 118/723 R; 204/298.34

[56] References Cited

U.S. PATENT DOCUMENTS

| | | | |
|---|---|---|---|
| 4,392,915 | 7/1983 | Zajac | 156/643 |
| 4,615,755 | 10/1986 | Tracy et al. | 156/345 |
| 4,981,722 | 1/1991 | Möller et al. | 156/345 X |
| 5,000,113 | 3/1991 | Wang et al. | 156/345 X |

FOREIGN PATENT DOCUMENTS

| | | | |
|---|---|---|---|
| 3633386 | 4/1988 | Germany | . |
| 62-47130 | of 0000 | Japan | H01L 21/302 |
| 61-39520 | 2/1986 | Japan | H01L 21/302 |
| 47130 | 2/1987 | Japan | 156/345 |

*Primary Examiner*—Thi Dang
*Attorney, Agent, or Firm*—Birgit Morris

[57] ABSTRACT

Disclosed is a system, including both method and apparatus, for enhancing the plasma etching of a semiconductor wafer. The system enhances etchant uniformity while greatly reducing plasma contamination. Etching is performed in a housing for processing a semiconductor wafer having a wafer perimeter defined by an outer wafer edge, a top surface and a bottom surface. The plasma etch technique includes a plasma positioned substantially coplanar with and proximate,to the semiconductor wafer. The plasma has a perimeter defined by an outer plasma edge and extending beyond substantially all of the wafer perimeter. Provided is a means for introducing an inert gas between the wafer perimeter and the plasma perimeter so the inert gas may or may not hit the wafer's bottom surface. Plasma and wafer can each have a circular shape where the plasma and the wafer are proximate to each other. Further provided can be a plasma focussing device having an inner wall residing beside and encircling that portion of the plasma overlying the wafer, the device positioned coaxially with the wafer and having a diameter larger than the wafer diameter.

4 Claims, 2 Drawing Sheets

PLASMA ETCH SYSTEM

This application is a continuation of application Ser. No. 08/367,909 filed Jan. 3, 1995, now abandoned.

BACKGROUND OF THE INVENTION

The field of this invention relates generally to the plasma etching of semiconductor wafers, and more particularly to plasma etch apparatus designed to enhance etch uniformity and to inhibit the undesirable formation and deposition of particulates in the etch environment.

FIGS. 1A and 1B (prior art) illustrate the state of the art with an example of a conventional plasma etch system 20. A sealable chamber or housing 22 is coupled to a vacuum system (not shown) for evacuating the housing. Housing 22 typically has a movable door (not shown) for accessing the interior of housing 22. A pedestal 24 is secured inside housing 22 for receiving a wafer to be processed.

When preparing to perform a plasma etch process, a semiconductor wafer 26 is placed on top of pedestal 24 and clamped securely in place with a clamping ring 28 which generally is formed into the shape of an annulus. Toward its bottom edge, clamping ring 28 is provided with a plurality of inwardly extending fingers 31 used for contacting wafer 26 when clamping wafer 26 in place. Clamping ring 28 has an internal diameter shown in the drawings as a diameter d2, which is somewhat larger than the diameter of the wafer being etched.

One goal during plasma etching is to cover as little of the peripheral surface of wafer 26 as possible. Therefore clamping fingers 31 are designed to minimize their coverage of the wafer periphery and to minimize abberations caused by the fingers contacting the wafer.

Next, a plasma focus ring 30 having an interior diameter d1 and a ring height h1 can be placed over and into-contact with clamping ring 28. As discussed below, d1 also approximately equals the diameter of the plasma portion placed proximate to the exposed d2 portion of wafer 26.

Now that the parts are in place inside housing 22, the housing is closed and sealed tightly. A vacuum system evacuates the housing to create a vacuum inside into which a suitable etching gas is introduced. A plasma 32 typically is produced by coupling an RF (radio frequency) power source (not shown) to pedestal 24 according to standard processing methods.

At least a portion of plasma 32 occupies the interior volume defined within plasma ring 30. As is known to these skilled in the art, the plasma has a continuously varying diameter which can be considered to be substantially "fixed" in the sense that the plasma has a time-averaged diameter which is substantially constant. Influences such as magnetic enhancement will make the plasma non-circular at any one point in time, thus causing the diameter to be non-constant and therefore different at any one particular moment in time.

Further, plasma 32 is in close proximity with a top surface 34 of wafer 26. As FIG. 1 shows, plasma diameter d1 is larger than wafer exposed diameter d2. The plasma etch process now begins, with plasma 32 proceeding to etch top surface 34 of wafer 26.

Additionally, it is common practice when performing plasma etching to provide some form of cooling for silicon wafer 26 to keep it from being degraded or otherwise harmed by the heat produced within housing 22. In one arrangement a solid annular washer 23 is inserted between wafer 26 and pedestal 24; these three parts are sealed tightly together to prevent fluid leaks and the parts thereby define a gap 25. An inlet pipe 33, formed so wafer 26 can be placed coaxially with pipe 33 provides fluid communication into and out of gap 25. A cooling or cooled fluid such as a gas 39 is then injected through pipe 33 and into gap 25 where gas 39 provides a thermal conduction path between wafer 26 and pedestal 24.

One problem with present plasma etch techniques is the contamination of etch plasma 32 with contaminants such as particulates or involatile materials that are produced as by-products of the plasma etching process.

For example, a first form of typical contaminants is a plurality of effluents 36 which escape from top surface 34 of wafer 26 during etching. A second form of contaminants is a group of compounds 38 formed in plasma 32 during the etching process, such as particulates or involatile materials created by the chemical bonding of component constituents suspended and moving within the plasma. Effluents 36 and compounds 38 are examples of a species of particulates 40.

Particulates 40 and other involatile materials will adhere to the surfaces of structures residing within housing 22. Plasma contamination is made worse as a result of particulates 40 coming into contact with an interior wall 42 of plasma ring 30. The result is that particulates 40 loosely adhere to wall 42 and may become dislodged onto the wafer when the focus ring is moved. Also, involatile materials may precipitate onto wall 42 to form a film 44.

Film 44 is a source of further contamination due to thermal cycling occurring as an inherent feature of the plasma etch process. Wall 42 and film 44, being composed of different materials, may have different coefficients of thermal expansion and contraction. When film 44 is formed on wall 42, both film and wall are hot.

When silicon wafers are exchanged—that is, a completed processed wafer is removed and replaced with a wafer to be processed—in the process chamber or housing 22, the plasma is turned off, an action which allows the internal surfaces in the housing to be cooled. When this happens, both wall and film contract at different rates because they have different coefficients of expansion. Wall and film are then heated again, and again they expand at different rates. As this cycle is repeated, film 44 can crack and shower particles onto top surface 34 of wafer 26.

FIG. 1C (prior art) shows a reactive gas species concentration distribution occurring across diameter d1. The horizontal or x-axis is a measure of distant along d1 and the vertical or y-axis is a measure of the reactive gas species concentration of that portion of plasma 32. Most desirable is to have a substantially flat concentration profile indicative of uniform reactive gas species concentration, which leads to more uniform etching. However, as shown in regions 48 and 50, etchant gas concentration undesirably increases toward the wafer periphery where the plasma approaches and overlaps the edge of wafer 26.

This cup-shaped concentration profile is undesirable because the result is that wafer etching is less controlled toward the wafer perimeter. The density profile in region 52 is uniform and therefore desirable. The preferred overall profile would extend region 52 by extensions 54 and 56 so the overall density profile would be substantially flat and uniform, thus providing uniform etching over the entire exposed top surface 34 of wafer 26. This improved uniformity can be achieved by enclosing the wafer area with a plasma ring 30. However, as has been shown above, ring 30 by relieving one introduces a new problem of contributing to plasma contamination Therefore the technology will be improved if a system can be provided that will lessen or eliminate particulates as a source of pollution in a plasma etch environment and provide a more uniform reactive gas species concentration profile.

SUMMARY OF THE INVENTION

In a broad sense, this invention provides a system for enhancing etch uniformity while diminishing plasma environment contamination.

In a first approach, this invention provides a method for enhancing a plasma etch technique of the type typically used in a housing for processing a semiconductor wafer having a wafer diameter, a top surface and a bottom surface. The plasma etch technique includes the use of a plasma (a) positioned substantially coaxially with the semiconductor wafer and (b) having a plasma diameter which is larger than the wafer diameter.

This method comprises the step of introducing an inert gas between the wafer diameter and the plasma diameter such that the inert gas does not impinge upon the bottom surface of the wafer. In an alternative method the gas does contact the bottom surface of the wafer and then is directed away from the bottom of the wafer in a non-radial manner.

Further, the method can include the step of forming a plasma focussing device, such as a plasma focus ring or a gaseous shroud. The device defines as part of itself an interior surface residing proximate to and encircling that portion of the plasma overlying the wafer. Also the device is positioned coaxially with the semiconductor wafer and has a device diameter which is larger than the wafer diameter.

In a second approach, this invention provides an apparatus for enhancing a plasma etch technique performed in a housing for processing a semiconductor wafer having a wafer perimeter defined by an outer wafer edge, a top surface and a bottom surface.

The plasma etch technique includes the use of a plasma positioned substantially coplanar with and proximate to the semiconductor wafer, the plasma having a plasma perimeter defined by an outer plasma edge and extending beyond substantially all of the wafer perimeter. The apparatus comprises a first means for introducing an inert gas between the wafer perimeter and the plasma perimeter such that the inert gas does not impinge upon the bottom surface of the wafer. Again, an alternative embodiment is to let the gas impinge upon the bottom surface of the wafer and then deflect upwardly.

The apparatus further provides that the plasma has, a time-averaged shape that is substantially circular at the location where the plasma and the wafer are proximate to each other. Also the apparatus can include a second means for focussing the plasma, such as a plasma focus ring or a gaseous shroud. The second means is formed with an interior surface residing proximate to and encircling that portion of the plasma overlying the wafer. The second means is positioned coaxially with the wafer and has a second means diameter which is larger than the wafer diameter.

Two advantages of this invention are that (1) it helps prevent the formation and deposition of contaminants, and (2) it helps sustain a uniform reactive species density by diluting the plasma near the periphery of the wafer.

Additional advantages of this invention will be evident to those skilled in this technical art by a study of the interrelated Detailed Description & Drawings; these two together discribe a specific example system thought by the inventor to be the best mode of practicing the claimed invention.

DETAILED DESCRIPTION OF THE PREFERRED EMBODIMENTS

Figure 1A:
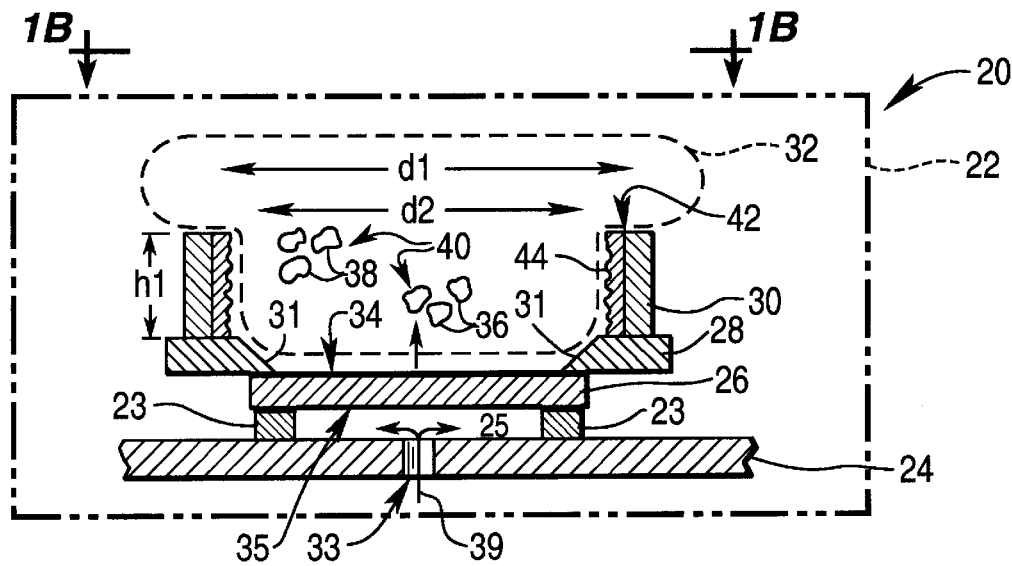
FIG. 1A shows a side cutaway view of a prior art plasma etching system.

Broadly stated, and as shown in FIG. 2, this invention provides a system 21, including method and apparatus, for enhancing a plasma etch technique of the type typically used in a housing 22 for processing a semiconductor wafer 26 having a wafer diameter d2, a top surface 34 and a bottom surface 35. Included is use of a plasma 32 positioned substantially coaxially with a semiconductor wafer 26 and having a time-averaged plasma diameter d1 which is larger than wafer diameter d2.

System 21 provides method and apparatus comprising the step of and structure for introducing an inert gas 60 between wafer diameter d2 and plasma diameter d1 such that inert gas 60 in a first embodiment does not impinge upon bottom surface 35 of wafer 26. Alternatively gas 60 in a second embodiment can be directed to impinge on surface 35 and then be deflected upwardly.

The system method and apparatus further include both the step of and the structure for forming a plasma focussing device 62 having a height h1 and a diameter d1. Height h1 can be reduced or replaced by the inert gas, thus eliminating a need for the focus ring because the gas alone can be sufficient to obtain the uniform etchant concentration desired. Device 62 defines as part of itself an interior surface 64 residing proximate to and encircling that portion of plasma 32 overlying wafer 26. The focussing device is positioned coaxially with wafer 26; further, device 62 has a diameter d1 which is generally larger than wafer diameter d2, where d2 is the diameter of the wafer portion actually exposed to the etching plasma.

Figure 1B:
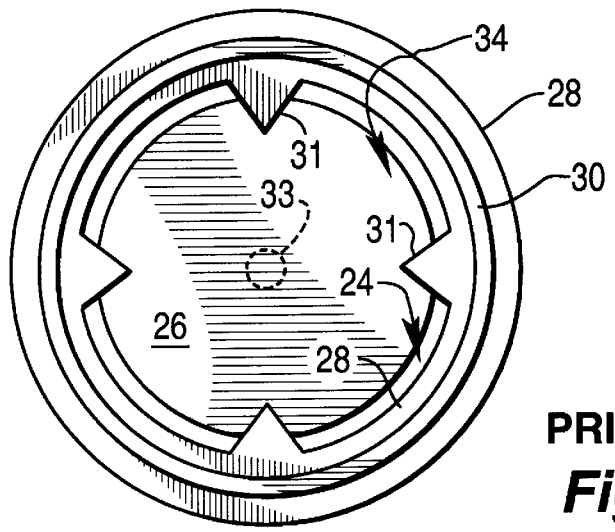
FIG. 1B is a top plan view of FIG. 1A taken along a line 1B—1B.
Figure 1C:
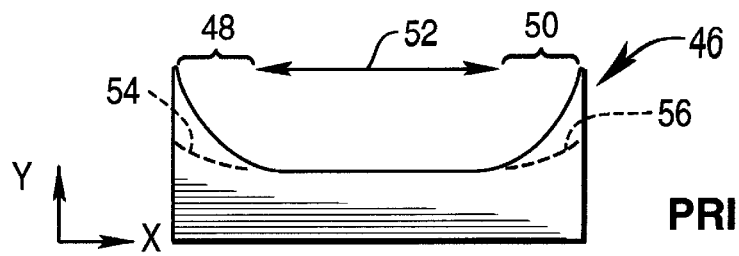
FIG. 1C shows a reactive gas species concentration distribution density profile of the prior art system shown in FIG. 1A.
Figure 2A:
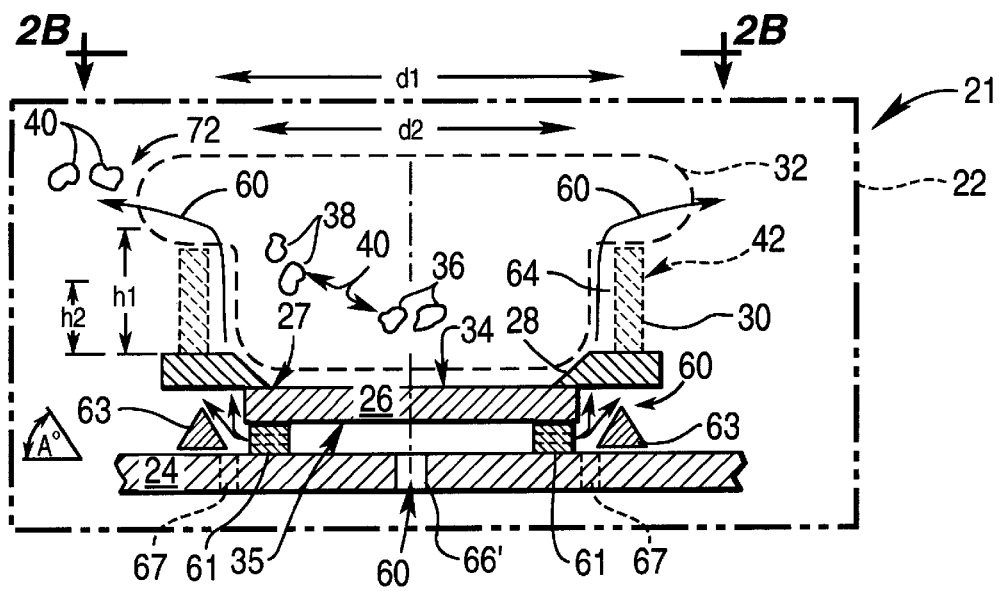
FIG. 2A shows a side cutaway view of an example plasma etch system according to the present invention.
Figure 2B:
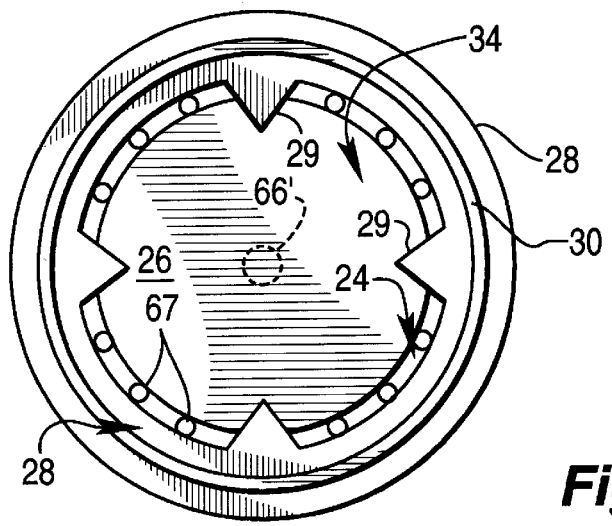
FIG. 2B is a top plan view of FIG. 2A taken along a line 2B—2B.

More narrowly stated, and as illustrated in FIGS. 2A and 2B, the invention can be practiced using at least some of the. system described above and shown in FIGS. 1A and 1B. Therefore the same reference numbers for parts are used in those figures where the parts are the same. Additionally, FIG. 2A includes new structure required for practicing the invention.

Sealable housing 22 for containing plasma 32 includes pedestal 24 which suppports wafer 26. Plasma focussing device 62, for those plasma etching processes which use them, is placed over clamping ring 28 to focus at least a portion of the plasma over and proximate to top surface 34 of wafer 26. Clamping ring 28 can have tabs or fingers 31 to hold wafer 26 firmly in place on pedestal 24.

Plasma focussing device 62 is shown with a dashed line as a ghost image to indicate that focus device 62 can be formed in various ways. For example, device 62 can be formed (a) as (see FIG. 1A) a focus ring 30 preferably made of a solid dielectric material or (b) as a gaseous shroud (not explicitly shown) comprised of a gas, preferably an inert gas to prevent chemical interaction between the gas and the plasma.

After housing 21 is sealed and evacuated, and plasma 32 is in place to perform the plasma etching process on wafer 26, inert gas 60 is introduced at variable flow rates through for example a plurality of port(s) 67 provided at intervals in a circular pattern on pedestal 24. Clamping ring 28 is positioned over wafer 26 so clamping fingers 31 do not overlie ports 66, thus permitting an unimpeded flow of inert gas 60 emerging through ports 67.

Alternatively, a concentric stream of gas 60 can be guided for example with baffles (not shown) to flow past the wafer's perimeter, which in this case is a circumference 27 of circular wafer 26. Circumference 27 corresponds to wafer diameter d2 measured across wafer upper surface 34; d2 establishes the area of wafer which is actually exposed to etching by plasma 32. That portion of wafer 26 underlying clamping fingers 31 FIGS. 1A and 2A is not exposed to the etching plasma because of being covered by the respective fingers.

Wafer 26 can have a non-circular perimeter (not shown) when the wafer has a non-circular shape (not shown), in which case (a) the plasma overlying this wafer perimeter will extend at least beyond the edge of the wafer perimeter and (b) the inert gas will be introduced to flow past the wafer outside the wafer perimeter while preferably not impinging upon the bottom of the wafer. However, wafers more typically are fabricated into a form having a substantially circular shape.

Examples of suitable inert gases for practicing this invention include argon, helium, krypton and nitrogen. Inert gas flow rates can be over a broad band, for example, flow rates of between about 5% and 50% of a total gas flow (not shown) into sealed housing 22. As is known to those skilled in the art, inert gas 60 is only one of several gases that flow into the reactor while operating; for example, other gases include the reactive gases (not shown) used for forming plasma 32.

Total inert gas flows can range from about 5 to 100 sccm. For example typical flow values are on the order of about 20 sccm inert gas flow and about 80 sccm reactive gas flow. Chamber or housing 22 volumes can vary from about 1 liter to about 20 liters. Gas 60 is preferably directed to avoid impinging upon bottom surface 35 of wafer 26 and to flow between diameter d2 of exposed wafer top surface 34 and diameter d1 of plasma 32 encircled by focussing device 62; wafer diameter d2 is smaller than plasma diameter d1.

Gas 60 can be introduced in various ways. For example, gas 60 can be introduced (a) in a direction substantially perpendicular to top surface 34 of wafer 26 and parallel to the coaxial axes—that is, a plasma axis 68 which is coaxial with a wafer axis 70—of focus device 62 and wafer 26, and (b) in a quantity sufficient to mix with and dilute the gaseous concentration of the plasma proximate to the outer perimeter wafer, that is, in the same region as circumference 27.

Further, gas 60 can be introduced (c) in a quantity sufficient to inhibit the formation of a plurality of particulates 40 normally produced by chemical processes during the plasma etch process; (d) in a quantity sufficient to transport at least a portion of particulates 40 over the top of and away from plasma focussing device 62 into an exterior region 72; and (e) in a quantity sufficient to inhibit the formation of film 44 (see FIG. 1A) on the interior surface or ring wall 42.

Figure 2C:
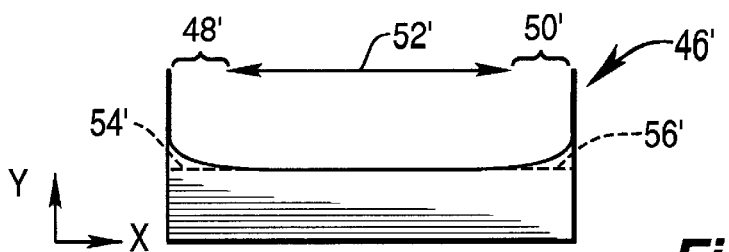
FIG. 2C shows a reactive gas species concentration distribution density profile of an example plasma etch system according to the present invention.

As the flow rates and volumes of gas 60 increase separately or together, wall height h1 can be reduced down to a reduced wall height h2 as the reactive species density profile shown in FIG. 2C flattens in regions 48' and 50' to form an improved profile at 54' and 56'. Finally wall height h1 can be reduced to zero by completely eliminating the focus rings if a sufficient amount of gas is delivered for achieving the reactive species density profile shown in FIG. 2C.

FIGS. 2A and 2B also show an alternate embodiment wherein inert gas 60 is aimed to impinge on bottom 35 of wafer 26. According to this embodiment, ports 66 are moved inward the center of pedestal 24 and repositioned for example as shown as ports 66'. A fluid-permeable riser 61, for example formed as a single annular washer (similar in shape to washer 23 above) or as a plurality of individual spaced-apart risers, supports wafer 26 above and away from the top surface of pedestal 24.

A gas-directing baffle 63, formed for example as a continuous annular structure or as a grouping of individual spaced-apart pieces, is interposed between pedestal 24 and wafer 26 around the bottom circumference of wafer 26. Inert gas 60 is then introduced through and emerges from ports 66', impinges upon and flows horizontally along the wafer bottom, penetrates through riser 61, and encounters baffle 63 to be re-directed in an upward direction toward plasma 32 and past but in close proximity to plasma focussing device 62.

Alternatively gas 60 can released toward the periphery of wafer 26, thus permitting the gas to move at an angle A of 90 degrees or at some other angle A depending on the location of ports 67 and baffles 63. Gas 60 can be thus released into the chamber non-radially (with reference to wafer 26) and at an angle A with respect to the horizontal ranging from almost 0 (zero) to almost 180 degrees, preferably in a angle A range of from about 45 to 135 degrees from the horizontal.

It is to be understood that the above combination of Drawings and Detailed Description presents a specific example(s) of only one way out of the many ways possible for practicing the invention; however, the above does not define the invention. Instead the much broader scope, and the definition of the invention itself, can only be determined by a careful analysis of the appended Claims.

The invention claimed is:

1. An apparatus for enhancing a plasma etch technique performed in a housing for processing a semiconductor substrate having a substrate perimeter defined by an outer substrate edge, a top surface and a bottom surface, the plasma etch technique including the use of a plasma positioned substantially coplanar with, and proximate to, the semiconductor substrate and having a time-averaged circular shape where the plasma and the substrate are proximate to each other, the plasma having a plasma perimeter defined by an outer plasma edge and extending beyond substantially all of the substrate perimeter, the apparatus comprising:

an inert gas inlet means mounted beyond the substrate perimeter but inside the plasma perimeter for introducing an inert gas between the substrate and the plasma perimeter so that the inert gas does not impinge upon the bottom surface of the substrate, a plasma focussing device formed with an interior surface residing proximate to and encircling the plasma overlying the substrate, the plasma focussing device being positioned coaxially with the substrate and having a diameter which is larger than the substrate diameter.

2. The apparatus defined in claim 1 wherein
the plasma focussing device is selected from the group consisting of a plasma focus ring and a gaseous shroud.

3. The apparatus defined in claim 1 wherein
said gas inlet means introduces the inert gas in a direction substantially perpendicular to the top surface of the substrate and substantially parallel to the coaxial axes of the plasma focussing device.

4. The apparatus defined in claim 1 wherein
said gas inlet source provides a flow of inert gas in a quantity sufficient to inhibit the formation of a film on the interior surface of the plasma focusing device, the film if formed including at least a portion of a plurality of involatile materials and particulates normally produced during the plasma etch process.

* * * * *